United States Patent
Lee et al.

(10) Patent No.: US 10,269,445 B1
(45) Date of Patent: Apr. 23, 2019

(54) MEMORY DEVICE AND OPERATING METHOD THEREOF

(71) Applicant: NANYA TECHNOLOGY CORPORATION, New Taipei (TW)

(72) Inventors: Chung-Hsun Lee, New Taipei (TW); Hsien-Wen Liu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/790,046

(22) Filed: Oct. 22, 2017

(51) Int. Cl.
*G11C 7/00* (2006.01)
*G11C 29/00* (2006.01)
*G11C 5/14* (2006.01)

(52) U.S. Cl.
CPC .............. *G11C 29/783* (2013.01); *G11C 5/14* (2013.01)

(58) Field of Classification Search
USPC .......................................................... 365/222
See application file for complete search history.

(56) References Cited

U.S. PATENT DOCUMENTS

| | | | | |
|---|---|---|---|---|
| 6,199,139 | B1* | 3/2001 | Katayama | G06F 1/3203 711/106 |
| 6,965,537 | B1* | 11/2005 | Klein | G06F 11/106 365/200 |
| 7,184,352 | B2* | 2/2007 | Klein | G06F 11/106 365/200 |
| 7,836,374 | B2* | 11/2010 | Klein | G11C 7/20 714/754 |
| 7,900,120 | B2* | 3/2011 | Pawlowski | G06F 11/1044 714/764 |
| 8,347,171 | B2* | 1/2013 | Seo | G06F 11/1048 714/754 |
| 8,832,522 | B2* | 9/2014 | Pawlowski | G06F 11/1044 714/754 |
| 9,472,261 | B1* | 10/2016 | Chun | G11C 29/023 |
| 2003/0149929 | A1* | 8/2003 | White | G06F 11/106 714/766 |
| 2006/0010264 | A1* | 1/2006 | Rader | B65H 35/0013 710/23 |
| 2006/0195755 | A1* | 8/2006 | Brown | G06F 11/106 714/754 |
| 2006/0206769 | A1* | 9/2006 | Klein | G06F 11/1052 714/52 |
| 2008/0092016 | A1* | 4/2008 | Pawlowski | G06F 11/1044 714/764 |
| 2009/0161459 | A1* | 6/2009 | Kohler | G11C 11/406 365/201 |

(Continued)

*Primary Examiner* — Viet Q Nguyen
(74) *Attorney, Agent, or Firm* — CKC & Partners Co., LLC

(57) ABSTRACT

A memory device includes a memory array, an error correction code (ECC) circuit, and a control circuit. The memory array includes plural memory rows and stores a plurality of data. The control circuit is configured to enter the memory device into a power saving mode with a first refresh rate to refresh the memory array, to control the ECC circuit to generate a first ECC according to first data during refreshing the memory array by the first refresh rate, to reduce the first refresh rate to a second refresh rate, to control the ECC circuit to determine whether an error exists in the first data during refreshing the memory array by the second refresh rate. If the error exists in the first data, the control circuit is further configured to control the ECC circuit to correct the first data.

14 Claims, 3 Drawing Sheets

(56) References Cited

U.S. PATENT DOCUMENTS

| | | | | |
|---|---|---|---|---|
| 2009/0249169 | A1* | 10/2009 | Bains | G06F 11/106 |
| | | | | 714/766 |
| 2011/0161748 | A1* | 6/2011 | Casper | G11C 5/02 |
| | | | | 714/708 |
| 2012/0243299 | A1* | 9/2012 | Shau | G11C 7/1006 |
| | | | | 365/149 |
| 2014/0164820 | A1* | 6/2014 | Franceschini | G11C 11/406 |
| | | | | 714/6.11 |
| 2015/0261284 | A1* | 9/2015 | Lee | G06F 1/3234 |
| | | | | 713/323 |
| 2015/0331732 | A1* | 11/2015 | Giovannini | G11C 11/406 |
| | | | | 714/704 |
| 2015/0363261 | A1* | 12/2015 | Warnes | G11C 29/028 |
| | | | | 714/721 |
| 2016/0034348 | A1* | 2/2016 | Park | G11C 29/42 |
| | | | | 714/764 |
| 2016/0301428 | A1* | 10/2016 | Andrade Costa | G06F 11/1048 |
| 2017/0169902 | A1* | 6/2017 | Chun | G06F 11/1016 |
| 2018/0232275 | A1* | 8/2018 | Casper | G11C 5/02 |
| 2019/0006001 | A1* | 1/2019 | Chun | G11C 11/40607 |

* cited by examiner

MEMORY DEVICE AND OPERATING METHOD THEREOF

BACKGROUND

Technical Field

The present disclosure relates to memory technology. More particularly, the present disclosure relates to a memory device and an operating method thereof.

Description of Related Art

Memory device may operate in power saving mode. When memory device operates in power saving mode, power consumption is still difficult to be reduced because of refresh process.

SUMMARY

An aspect of the present disclosure is to provide a memory device. The memory device comprises a memory array, an error correction code (ECC) circuit, and a control circuit. The ECC circuit is coupled to the memory array. The control circuit is coupled to the memory array and the ECC circuit. The memory array comprises a plurality of memory rows and configured to store a plurality of data. The control circuit is configured to enter the memory device into a power saving mode with a first refresh rate to refresh the memory array, to control the ECC circuit to generate a first ECC according to first data during refreshing the memory array by the first refresh rate, to reduce the first refresh rate to a second refresh rate, to control the ECC circuit to determine whether an error exists in the first data during refreshing the memory array by the second refresh rate. The first data is stored in a first memory row of the memory rows. If the error exists in the first data, the control circuit is further configured to control the ECC circuit to correct the first data.

Another aspect of the present disclosure id to provide an operating method of a memory device. The operating method comprises operations as follows. By a control circuit, a power saving mode with a first refresh rate is entered to refresh a memory array. By the control circuit, during a refresh operation with the first refresh rate, an error correction code (ECC) circuit is controlled to generate a first ECC according to first data. The first data is stored in a first memory row of the memory array. By the control circuit, the first refresh rate is reduced to a second refresh rate. By the control circuit, during the refresh operation with the second refresh rate, the ECC circuit is controlled to determine whether an error exists in the first data. By the control circuit, if the error exists in the first data, the ECC circuit is controlled to correct the first data.

In sum, the control circuit reduces the first refresh rate to the second refresh rate so that power consumption of the memory device is effectively reduced. Moreover, the control circuit controls the ECC circuit to determine whether an error exists in the data during refreshing the memory array by the second refresh rate, and controls the ECC circuit to correct the data so that accuracy of the data is improved.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise indicated, all numbers expressing quantities, conditions, and the like in the instant disclosure and claims are to be understood as modified in all instances by the term "about." The term "about" refers, for example, to numerical values covering a range of plus or minus 20% of the numerical value. The term "about" preferably refers to numerical values covering range of plus or minus 10% (or most preferably, 5%) of the numerical value. The modifier "about" used in combination with a quantity is inclusive of the stated value.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
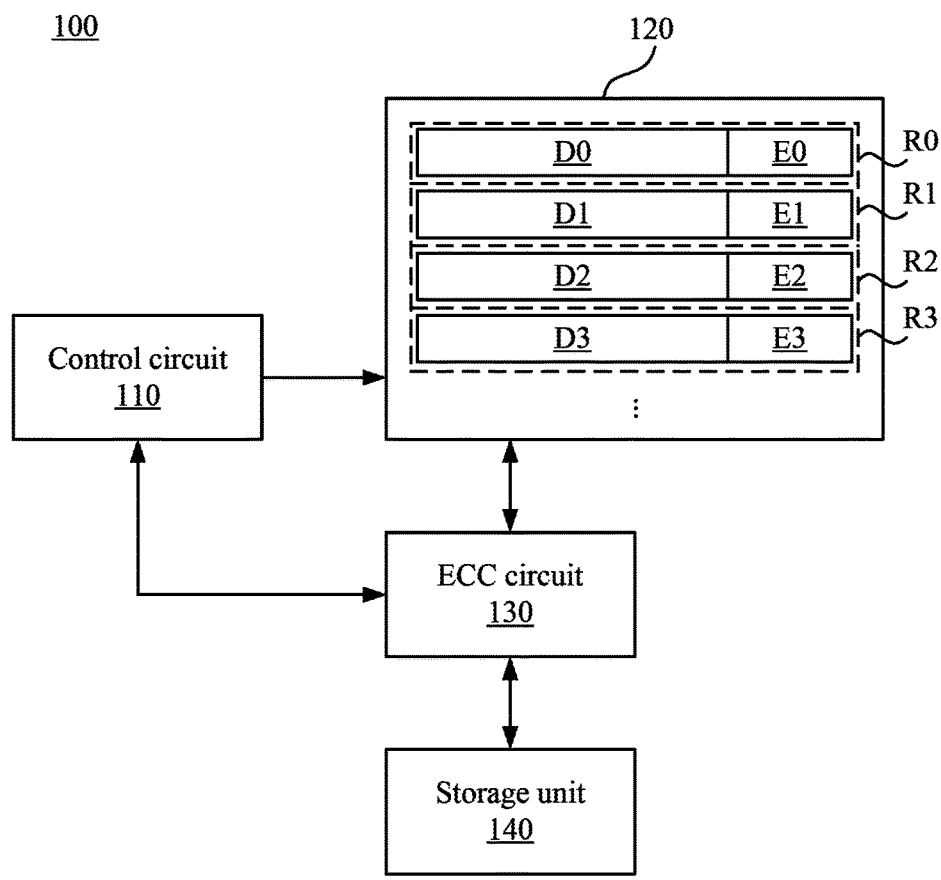
FIG. 1 is a schematic diagram of a memory device according to an embodiment of the present disclosure.
Figure 2:
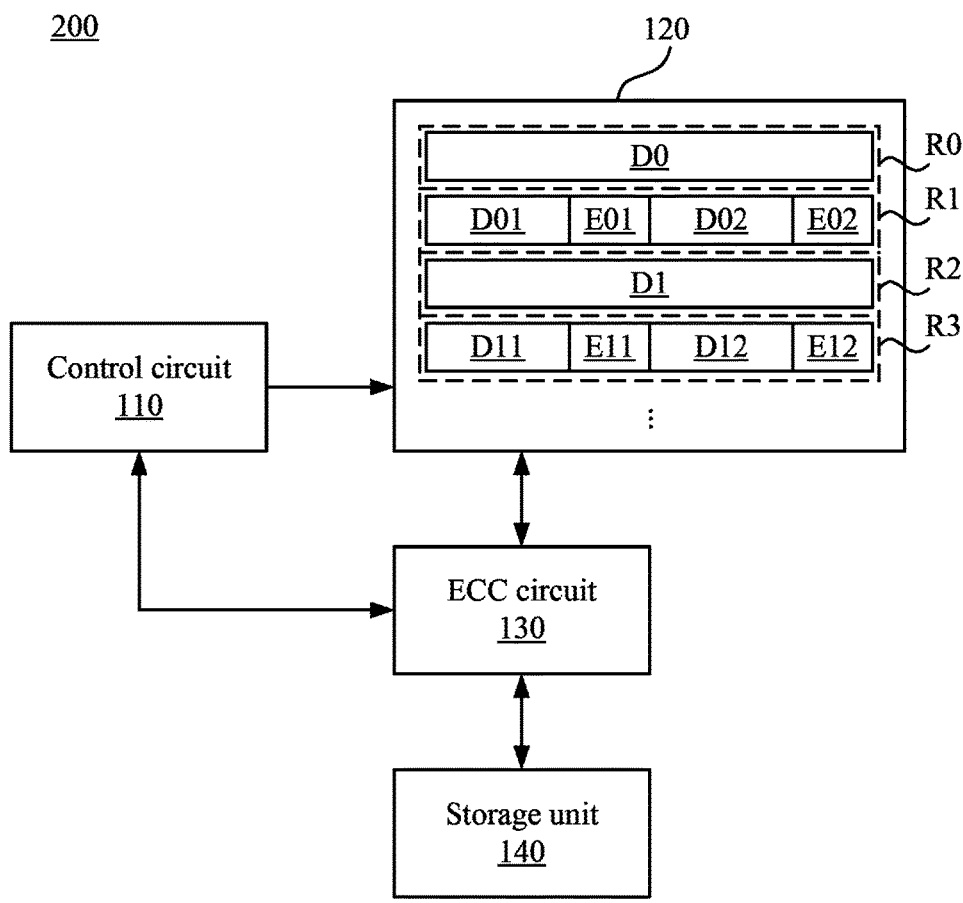
FIG. 2 is a schematic diagram of a memory device according to an embodiment of the present disclosure.

Reference is made to FIG. 1. FIG. 1 is a schematic diagram of a memory device 100 according to an embodiment of the present disclosure. FIG. 2 is a schematic diagram of a memory device 200 according to an embodiment of the present disclosure. With respect to the embodiment of FIG. 2, like elements in FIG. 1 are designated with the same reference numbers for ease of understanding. The memory device 100 includes a memory array 120, an error correction code (ECC) circuit 130 and a control circuit 110. The ECC circuit 130 is coupled to the memory array 120. The control circuit 110 is coupled to the memory array 120 and the ECC circuit 130. As shown in FIG. 1, the memory array 120 includes plural memory rows R0-R3, and the memory rows R0-R3 are configured to store plural of data D0-D3. It should be noted that spaces of each of the memory rows R0-R3 are kept for storing ECC E0-E3. However, the present disclosure is not limited thereto. In another embodiment, as shown in FIG. 2, in a memory array 120 of a memory device 200, the whole memory row R0 is used to store the data D0, and the whole memory row R2 is used to store the data D1.

Figure 3:
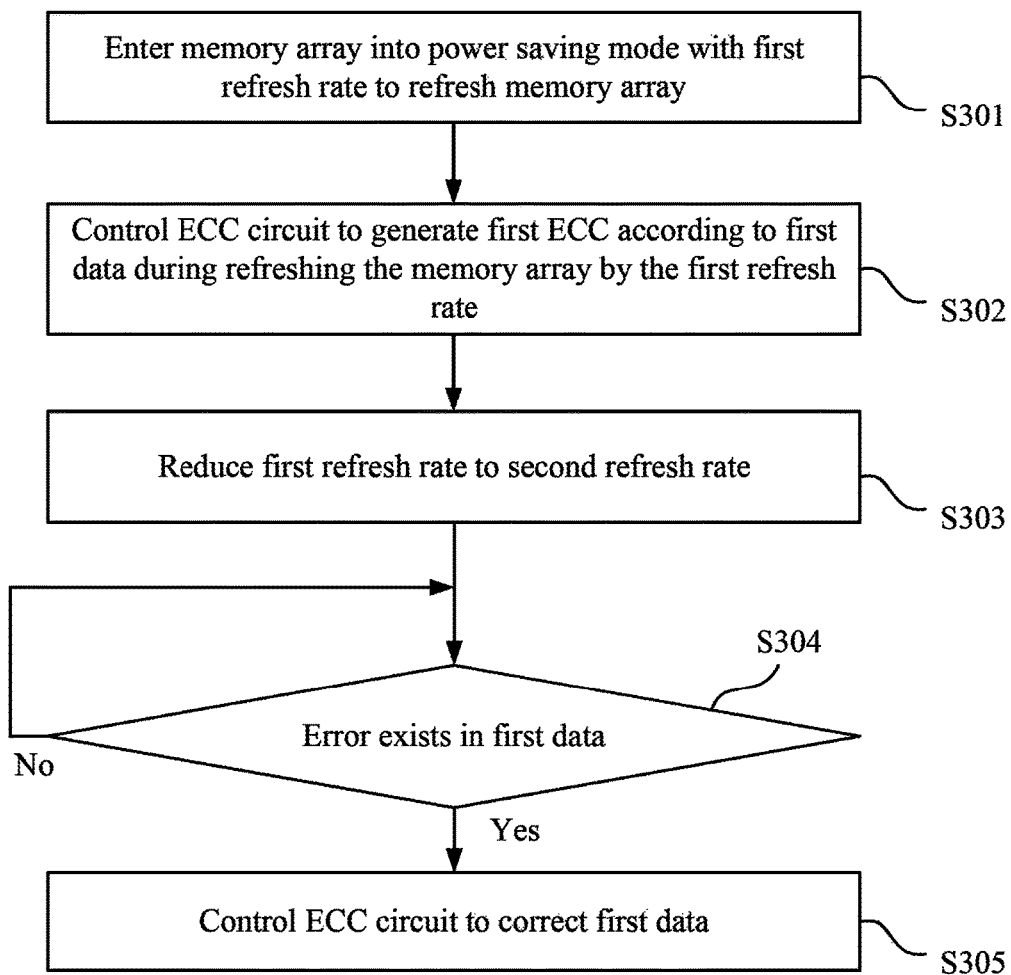
FIG. 3 is a schematic diagram of an operating method of a memory device in accordance with an embodiment of the present disclosure.

In operation, reference is made to FIG. 1, FIG. 2 and FIG. 3. FIG. 3 is a schematic diagram of an operating method 300 of the memory devices 100 and 200 in accordance with an embodiment of the present disclosure. The operating method 300 includes operations S301, S302, S303, S304 and S305. For ease of understanding, the operating method 300 is explained below with reference to FIG. 1 and FIG. 2. These operations are given for illustrative purposes. Additional operations are within the contemplated scoped of the present disclosure. For example, in various embodiments, additional operations are provided before, during, and/or after the operations in the operating method 300, and/or some of the operations described are replaced or eliminated for other embodiments of the operating method 300.

In operation S301, the control circuit 110 enters the memory array 120 into a power saving mode with a first refresh rate to refresh the memory array 120.

In operation S302, the control circuit 110 controls the ECC circuit 130 to generate a first ECC according to first data during refreshing the memory array 120 by the first refresh rate. For example, the control circuit 110 controls the ECC circuit 130 to generate an ECC E0 according to the data D0 during refreshing the memory array 120 by the first refresh rate. The control circuit 110 then controls the ECC circuit 130 to store the ECC E0 in the memory row R0. Similarly, the control circuit 110 controls the ECC circuit 130 to generate ECC E1-E3 according the data D1-D3 during refreshing the memory array 120 by the first refresh rate, and then controls the ECC circuit 130 to store the ECC E1-E3 in the memory rows R1-R3. However, the present disclosure is not limited thereto.

In another embodiment, as shown in FIG. 2, the data D0 includes the portion D01 and a portion D02. The control circuit 110 controls the ECC circuit 130 to generate a first ECC according to a first portion of the first data during refreshing the memory array 120 by the first refresh rate. For example, the control circuit 110 controls the ECC circuit 130 to generate an ECC E01 according to a portion D01 of the data D0 during refreshing the memory array 120 by the first refresh rate. The control circuit 110 then controls the ECC circuit 130 to store the ECC E01 and the portion D01 in the memory row R1. Similarly, the control circuit 110 controls the ECC circuit 130 to generate an ECC E02 according the portion D02 during refreshing the memory array 120 by the first refresh rate, and then controls the ECC circuit 130 to store the ECC E02 and the portion D02 in the memory row R1. The control circuit 110 controls the ECC circuit 130 to generate ECC E11 and E12 according portions D11 and D12 of the data D2 during refreshing the memory array 120 by the first refresh rate, and then controls the ECC circuit 130 to store the ECC E11 and E12 and the portions D11 and D12 in the memory row R3.

In still another embodiment, as shown in FIG. 1 and FIG. 2, the memory device 100 may include a storage unit (e.g., non-volatile memory) 140. The control circuit 110 may control the ECC circuit 130 to store the ECC E0-E3, E01, E02, E11 and E12 in the storage unit 140.

In operation S303, the control circuit 110 reduces the first refresh rate to a second refresh rate. As a result, power consumption of the memory device 100 (or 200) is effectively reduced when the memory device 100 (or 200) is operated in power saving mode with the reduced refresh rate (i.e., the second refresh rate).

In operation S304, the control circuit 110 controls the ECC circuit 130 to determine whether an error exists in the first data during refreshing the memory array 120 by the second refresh rate. For example, as shown in FIG. 1, the control circuit 110 controls the ECC circuit 130 to read the data D0 and the ECC E0 from the memory row R0, and controls the ECC circuit 130 to determine whether an error exists in the data D0 during refreshing the memory array 120 by the second refresh rate. However, the present disclosure is not limited thereto.

For another example, as shown in FIG. 2, the control circuit 110 controls the ECC circuit 130 to read the portion D01 of the data D0 and the ECC E01 from the memory row R1, and controls the ECC circuit 130 to determine whether an error exists in the portion D01 of the data D0 during refreshing the memory array 120 by the second refresh rate.

In still another embodiment, the ECC E0-E3, E01, E02, E11 and E12 are stored in the storage unit 140. The control circuit 110 may controls the ECC circuit 130 to read the data D0 from the memory row R0 and the ECC E0 from the storage unit 140, and controls the ECC circuit 130 to determine whether an error exists in the data D0 during refreshing the memory array 120 by the second refresh rate.

If the error exists is in the first data, the control circuit 110 controls the ECC circuit 130 to correct the first data in operation S305. For example, if the error exists is in the data D0, the control circuit 110 controls the ECC circuit 130 to correct the data D0. For another example, if the error exists is in the portion D01 of the data D0, the control circuit 110 controls the ECC circuit 130 to correct the portion D01 of the data D0.

In contrast, if no error exists in the first data (e.g., the data D0), t the control circuit 110 controls the ECC circuit 130 to determine whether an error exists in the first data during refreshing the memory array 120 by the second refresh rate in operation S304.

In an embodiment, the control circuit 110 controls the ECC circuit 130 to write the corrected first data and the first ECC back to the first memory row. For example, the control circuit 110 controls the ECC circuit 130 to write the corrected data D0 and the ECC E0 back to the memory row R0. For another example, the control circuit 110 controls the ECC circuit 130 to write the corrected portion D01 of the data D0 and the ECC E01 to the memory row R1 of the memory rows R0-R3, and the memory row R1 is different from the memory row R0. In an embodiment, the memory device 100 (or 200) includes the storage unit 140 to store an address mapping table. The control circuit 110 controls the ECC circuit 130 to record a relation between the memory row R0 and the memory row R1 in the address mapping table.

In an embodiment, the memory device 100 (or 200) includes the storage unit 140 to store an error table. For example, the control circuit 110 controls the ECC circuit 130 to record an address of the memory row R0 in the error table after the data D0 is corrected. As a result, addresses of memory rows that occur errors of the data are recorded in the error table for identifying weak memory rows.

It should be noted that existence of the error indicates that the second refresh rate is too low to maintain accuracy of the data D0 (or the portion D01). In an embodiment, the control circuit 110 increases the second refresh rate to a third refresh rate after the data D0 (or the portion D01) is corrected, and the third refresh rate is between the first refresh rate and the second refresh rate. As a result, power consumption of the memory device 100 (or 200) is reduced and accuracy of the data D0-D3 is improved when the memory device 100 (or 200) is operated in power saving mode with the refresh rate (i.e., the third refresh rate) that is smaller than the first refresh rate.

In another embodiment, if the error exists in the first data (e.g., the data D0), the control circuit 110 controls the ECC circuit 130 to determine whether a number of the error bit is larger than a threshold (may be determined according to actual demand). If the number of the error bit is larger than the threshold, the control circuit 110 increases the second refresh rate to a third refresh rate after the first data (e.g., the data D0) is corrected, and the third refresh rate is between the first refresh rate and the second refresh rate. As a result, with the threshold for the number of the error bit, power consumption of the memory device 100 (or 200) is reduced and accuracy of the data D0-D3 is flexibly adjusted when the memory device 100 (or 200) is operated in power saving mode with the refresh rate (i.e., the third refresh rate) that is smaller than the first refresh rate.

In sum, the control circuit 110 reduces the first refresh rate to the second refresh rate so that power consumption of the memory device 100 (or 200) is effectively reduced. Moreover, the control circuit 110 controls the ECC circuit 130 to determine whether an error exists in the data D0-D3 during refreshing the memory array 120 by the second refresh rate, and controls the ECC circuit 130 to correct the data so that accuracy of the data D0-D3 is improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A memory device, comprising:
a memory array, comprising a plurality of memory rows and configured to store a plurality of data;
an error correction code (ECC) circuit, coupled to the memory array; and
a control circuit, coupled to the memory array and the ECC circuit, wherein the control circuit is configured to enter the memory device into a power saving mode with a first refresh rate to refresh the memory array, to control the ECC circuit to generate a first ECC according to first data during refreshing the memory array by the first refresh rate, to reduce the first refresh rate to a second refresh rate, to control the ECC circuit to determine whether an error exists in the first data during refreshing the memory array by the second refresh rate, wherein the first data is stored in a first memory row of the memory rows,
wherein if the error exists in the first data, the control circuit is further configured to control the ECC circuit to correct the first data,
wherein the first ECC is generated according to a first portion of the first data, and the control circuit is further configured to control the ECC circuit to write a corrected first portion of the corrected first data and the first ECC to a second memory row of the memory rows, wherein the second memory row is different from the first memory row.

2. The memory device of claim 1, wherein the control circuit is further configured to increase the second refresh rate to a third refresh rate after the first data is corrected, wherein the third refresh rate is between the first refresh rate and the second refresh rate.

3. The memory device of claim 1, wherein if the error exists in the first data, the control circuit is further configured to control the ECC circuit to determine whether a number of the error bit is larger than a threshold, and
if the number of the error bit is larger than the threshold, the control circuit is further configured to increase the second refresh rate to a third refresh rate after the first data is corrected, wherein the third refresh rate is between the first refresh rate and the second refresh rate.

4. The memory device of claim 1, further comprising:
a storage unit, coupled to the ECC circuit and configured to store an error table, wherein the control circuit is further configured to control the ECC circuit to record an address of the first memory row in the error table after the first data is corrected.

5. The memory device of claim 1, wherein the control circuit is further configured to control the ECC circuit to write the corrected first data and the first ECC back to the first memory row.

6. The memory device of claim 1, further comprising:
a storage unit, coupled to the ECC circuit and configured to store an address mapping table, wherein the control circuit is further configured to control the ECC circuit to record a relation between the first memory row and the second memory row in the address mapping table.

7. The memory device of claim 1, further comprising:
a storage unit, coupled to the ECC circuit and configured to store the first ECC, wherein the control circuit is further configured to control the ECC circuit to store the first ECC in the storage unit.

8. An operating method of a memory device, comprising:
by a control circuit, entering a power saving mode with a first refresh rate to refresh a memory array;
by the control circuit, during a refresh operation with the first refresh rate, controlling an error correction code (ECC) circuit to generate a first ECC according to first data, wherein the first data is stored in a first memory row of the memory array;
by the control circuit, reducing the first refresh rate to a second refresh rate;
by the control circuit, during the refresh operation with the second refresh rate, controlling the ECC circuit to determine whether an error exists in the first data; and
by the control circuit, if the error exists in the first data, controlling the ECC circuit to correct the first data,
wherein the first ECC is generated according to a first portion of the first data, and the method further comprises:
by the control circuit, controlling the ECC circuit to write a corrected first portion of the corrected first data and the first ECC to a second memory row, wherein the second memory row is different from the first memory row.

9. The operating method of claim 8, further comprising:
by the control circuit, increasing the second refresh rate to a third refresh rate after the first data is corrected, wherein the third refresh rate is between the first refresh rate and the second refresh rate.

10. The operating method of claim 8, further comprising:
by the control circuit, if the error exists in the first data, determining whether a number of the error bit is larger than a threshold; and
by the control circuit, if the number of the error bit is larger than the threshold, increasing the second refresh rate to a third refresh rate after the first data is corrected, wherein the third refresh rate is between the first refresh rate and the second refresh rate.

11. The operating method of claim 8, further comprising:
by the control circuit, controlling the ECC circuit to record an address of the first memory row in an error table after the first data is corrected, wherein the error table is stored in a storage unit.

12. The operating method of claim 8, further comprising:
by the control circuit, controlling the ECC circuit to write the corrected first data and the first ECC back to the first memory row.

13. The operating method of claim 8, further comprising:
by the control circuit, controlling the ECC circuit to record a relation between the first memory row and the second memory row in an address mapping table, wherein the address mapping table is stored in a storage unit.

14. The operating method of claim 8, further comprising:
by the control circuit, controlling the ECC circuit to store the first ECC in a storage unit.

* * * * *